United States Patent
Park (10) Patent No.: US 9,331,145 B2
(45) Date of Patent: May 3, 2016

(54) LATERAL DOUBLE DIFFUSED MOS TRANSISTORS AND METHODS OF FABRICATING THE SAME

(75) Inventor: Sung Kun Park, Cheongju-si (KR)

(73) Assignee: SK HYNIX INC., Icheon-si (KR)

(*) Notice: Subject to any disclaimer, the term of this patent is extended or adjusted under 35 U.S.C. 154(b) by 1 day.

(21) Appl. No.: 13/537,355

(22) Filed: Jun. 29, 2012

(65) Prior Publication Data

US 2013/0187226 A1    Jul. 25, 2013

(30) Foreign Application Priority Data

Jan. 20, 2012  (KR) .................. 10-2012-0006787

(51) Int. Cl.
| | |
|---|---|
| H01L 27/02 | (2006.01) |
| H01L 29/06 | (2006.01) |
| H01L 29/40 | (2006.01) |
| H01L 29/66 | (2006.01) |
| H01L 29/78 | (2006.01) |
| H01L 29/08 | (2006.01) |
| H01L 29/10 | (2006.01) |

(52) U.S. Cl.
CPC .......... *H01L 29/0653* (2013.01); *H01L 29/402* (2013.01); *H01L 29/404* (2013.01); *H01L 29/66659* (2013.01); *H01L 29/7835* (2013.01); *H01L 29/0634* (2013.01); *H01L 29/0692* (2013.01); *H01L 29/0847* (2013.01); *H01L 29/1045* (2013.01)

(58) Field of Classification Search
CPC ...... H01L 21/8234; H01L 21/76; H01L 27/02
USPC ................ 257/141, E29.197, 368, 343, 335
See application file for complete search history.

(56) References Cited

U.S. PATENT DOCUMENTS

| | | | | |
|---|---|---|---|---|
| 4,890,146 | A * | 12/1989 | Williams et al. | 257/336 |
| 5,514,608 | A * | 5/1996 | Williams et al. | 438/286 |
| 7,582,533 | B2 | 9/2009 | Ko | |
| 7,601,600 | B2 | 10/2009 | Ko et al. | |
| 2006/0033156 | A1* | 2/2006 | Huang | H01L 29/0634 257/335 |

* cited by examiner

*Primary Examiner* — David Vu
*Assistant Examiner* — Mouloucoulaye Inoussa
(74) *Attorney, Agent, or Firm* — William Park & Associates Ltd.

(57) ABSTRACT

A lateral double diffused MOS transistor including substrate of a first conductivity type, drift region of a second conductivity type and body region of the first conductivity type disposed in the substrate, source region of the second conductivity type disposed in the body region, drain region of the second conductivity type disposed in the drift region, isolation layer disposed in the drift region to surround sidewalls of the drain region, gate insulation layer and gate electrode sequentially stacked generally on the body region, first field plate extending from the gate electrode to overlap the drift region and to overlap a portion of the isolation layer, second field plate disposed above the isolation layer spaced apart from the first field plate, and coupling gate disposed above the isolation layer generally between the drain region and the second field plate, wherein the coupling gate is electrically connected to the second field plate.

9 Claims, 6 Drawing Sheets

LATERAL DOUBLE DIFFUSED MOS TRANSISTORS AND METHODS OF FABRICATING THE SAME

CROSS-REFERENCES TO RELATED APPLICATIONS

The present application claims priority under 35 U.S.C. 119(a) to Korean Application No. 10-2012-0006787, filed on Jan. 20, 2012, in the Korean intellectual property Office, which is incorporated herein by reference in its entirety set forth in full.

BACKGROUND

1. Technical Field

Exemplary embodiments of the present disclosure relate to semiconductor devices and methods of fabricating the same and to lateral double diffused MOS (LDMOS) transistors and methods of fabricating the same.

2. Related Art

Integrated circuits having functions of both a controller and a driver may be employed in smart power devices. Output circuits of the smart power devices may include lateral double diffused MOS (LDMOS) transistors operating at high voltages. Thus, breakdown voltages of the LDMOS transistors, for example, a drain junction breakdown voltage and a gate dielectric breakdown voltage are important factors that may directly influence the stable operation of the LDMOS transistors. In addition, on-resistance (Ron) of the LDMOS transistors is also an important factor that may influence electrical characteristics of the LDMOS transistors. To reduce the on-resistance of the LDMOS transistors, a doping concentration of drift regions between drain regions and channel regions should be increased. However, in the event that the doping concentration of the drift regions increases, the drain junction breakdown voltage may be reduced. That is, in the LDMOS transistors, the on-resistance and the drain junction breakdown voltage may have a trade-off relationship.

BRIEF SUMMARY

Various embodiments are directed to lateral double diffused MOS (LDMOS) transistors and methods of fabricating the same.

According to some embodiments, a LDMOS transistor may include a substrate of a first conductivity type; a drift region of a second conductivity type and a body region of the first conductivity type disposed substantially in the substrate; a source region of the second conductivity type disposed substantially in the body region; a drain region of the second conductivity type disposed substantially in the drift region; an isolation layer disposed substantially in the drift region to substantially surround sidewalls of the drain region; a gate insulation layer and a gate electrode sequentially stacked generally on the body region; a first field plate extending from the gate electrode to overlap the drift region and to overlap a portion of the isolation layer; a second field plate disposed substantially above the isolation layer spaced apart from the first field plate; and a coupling gate disposed substantially above the isolation layer generally between the drain region and the second field plate, wherein the coupling gate is electrically connected to the second field plate.

According to other embodiments, a LDMOS transistor may include a substrate of a first conductivity type, a drift region of a second conductivity type and a body region of the first conductivity type disposed substantially in the substrate, a source region of the second conductivity type disposed substantially in the body region, a drain region of the second conductivity type disposed substantially in the drift region, an isolation layer disposed substantially in the drift region to substantially surround sidewalls of the drain region, a top region of the first conductivity type disposed in the drift region substantially underneath the isolation layer, a gate insulation layer and a gate electrode sequentially stacked generally on the body region, a first field plate extending from the gate electrode to overlap the drift region and to overlap a portion of the isolation layer, a second field plate disposed substantially above the isolation layer to be spaced apart from the first field plate, and a coupling gate disposed substantially above the isolation layer generally between the drain region and the second field plate, wherein the coupling gate is electrically connected to the second field plate.

According to other embodiments, a LDMOS transistor may include a substrate of a first conductivity type, a drift region of a second conductivity type and a body region of the first conductivity type disposed substantially in the substrate, a source region of the second conductivity type disposed substantially in the body region, a drain region of the second conductivity type disposed substantially in the drift region, an isolation layer disposed substantially in the drift region to substantially surround sidewalls of the drain region, an extended drain region of the second conductivity type substantially surrounding the drain region and the isolation layer disposed substantially in the drift region, and laterally extending to substantially contact a sidewall of the body region, a gate insulation layer and a gate electrode sequentially stacked generally on the body region, a first field plate extending from the gate electrode to overlap the extended drain region and to overlap a portion of the isolation layer, a second field plate disposed substantially above the isolation layer to be spaced apart from the first field plate, and a coupling gate disposed substantially above the isolation layer generally between the drain region and the second field plate. The coupling gate is electrically connected to the second field plate.

According to another embodiment, a method of fabricating an LDMOS transistor includes forming a drift region of a second conductivity type and a body region of a first conductivity type substantially in a substrate of the first conductivity type, forming a source region of the second conductivity type substantially in the body region and a drain region of the second conductivity type substantially in the drift region, forming an isolation layer substantially in the drift region to substantially surround sidewalls of the drain region, forming a gate insulation layer generally on the body region, forming a gate electrode disposed generally on the gate insulation layer to substantially overlap with the body region and a first field plate extending from the gate electrode to substantially overlap with the drift region and a portion of the isolation layer, and forming a coupling gate and a second field plate disposed generally on the isolation layer to be spaced apart from the first field plate, wherein the coupling gate is formed generally between the drain region and the first field plate, the second field plate is formed generally between the coupling gate and first field plate, and the coupling gate is electrically connected to the second field plate.

DETAILED DESCRIPTION OF THE EMBODIMENTS

Exemplary embodiments are described below with reference to the accompanying drawings. Many different forms and embodiments are possible without deviating from the spirit and teachings of this disclosure and so the disclosure should not be construed as limited to the exemplary embodiments set forth herein. Rather, these exemplary embodiments are provided so that this disclosure will be thorough and complete, and will convey the scope of the disclosure to those skilled in the art. In the drawings, the sizes and relative sizes of layers and regions may be exaggerated for clarity. The same reference numerals or the same reference designators denote the same elements throughout the specification.

Exemplary embodiments are described herein with reference to cross-section illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
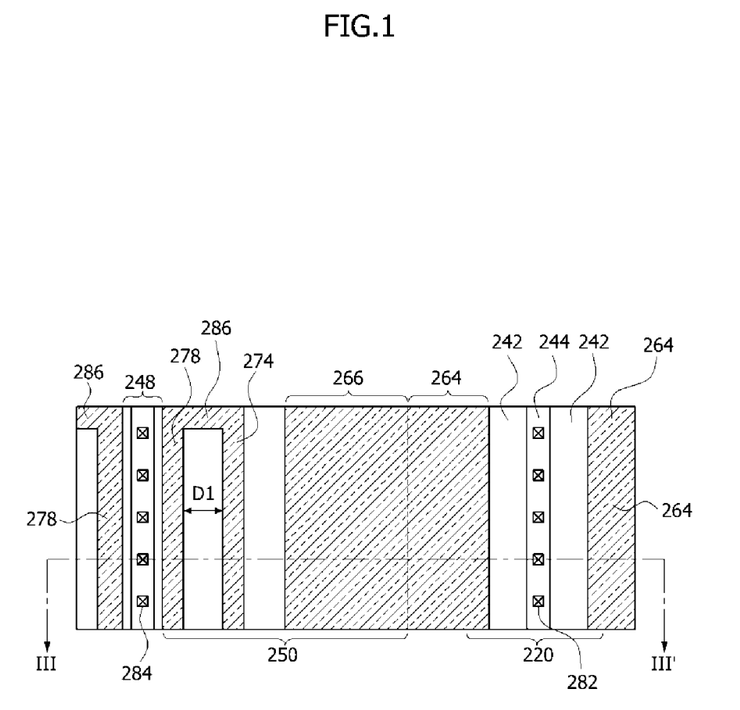
FIG. 1 is a layout illustrating an example of a LDMOS transistor according to an embodiment.
Figure 2:
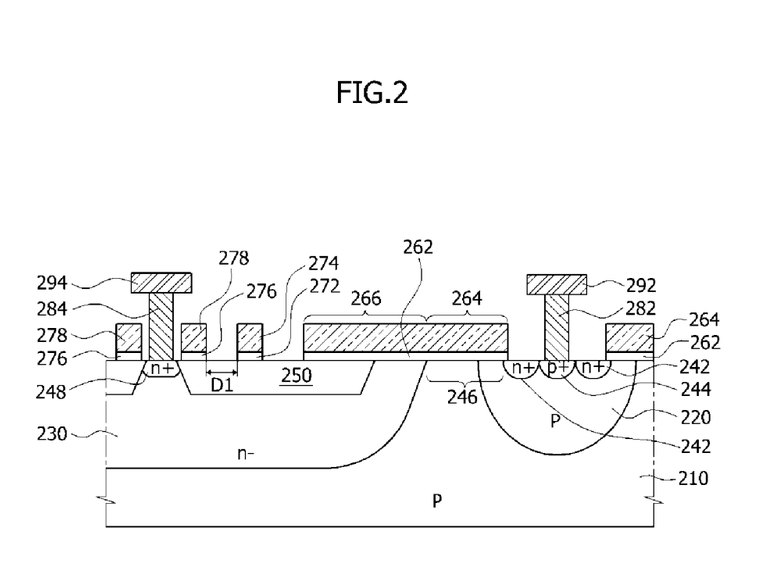
FIG. 2 is a cross sectional view taken along a line III-III' of FIG. 1.

FIG. 1 is a layout illustrating an LDMOS transistor according to an exemplary embodiment, and FIG. 2 is a cross sectional view taken along a line III-III' of FIG. 1. Referring to FIGS. 1 and 2, an LDMOS transistor according to the present embodiment may include a P-type substrate 210 (i.e., P) as well as a P-type body region 220 (i.e., P) and an N-type drift region 230 (i.e., n−) disposed substantially in the P-type substrate 210. The P-type body region 220 and the N-type drift region 230 may be spaced apart from each other in the P-type substrate 210, as illustrated in FIGS. 1 and 2. Alternatively, a sidewall of the P-type body region 220 may generally contact a sidewall of the N-type drift region 230. The P-type body region 220 and the N-type drift region 230 may be adjacent to a top surface of the P-type substrate 210. In an exemplary embodiment, the P-type body region 220 and the N-type drift region 230 may be silicon epitaxial layers formed substantially on the P-type substrate 210.

An N-type source region 242 (i.e., n+) and a P-type source contact region 244 (i.e., p+) may be disposed in the P-type body region 220. The N-type source region 242 and the P-type source contact region 244 may be generally disposed to be adjacent to a top surface of the P-type body region 220, and the N-type source region 242 may substantially surround sidewalls of the P-type source contact region 244. The P-type source contact region 244 may be electrically connected to a source electrode 292 through at least one first contact 282. In an embodiment, the first contact 282 may be disposed to substantially contact both the P-type source contact region 244 and the N-type source region 242.

Upper surface regions of the P-type substrate 210 and the P-type body region 220 between the N-type drift region 230 and the N-type source region 242 may act as a channel region 246. An isolation layer 250 may be disposed in the N-type drift region 230, and the isolation layer 250 may be adjacent to a top surface of the N-type drift region 230. An N-type drain region 248 (i.e., n+) may also be disposed in the N-type drift region 230, and the isolation layer 250 may substantially surround sidewalls of the N-type drain region 248. The N-type drain region 248 and the N-type source region 242 may generally have higher impurity concentrations than the N-type drift region 230. The N-type drain region 248 may be electrically connected to a drain electrode 294 through at least one second contact 284.

A gate insulation layer 262 may be disposed generally on the channel region 246, and a gate electrode 264 may be disposed substantially on the gate insulation layer 262 generally opposite to the channel region 246. In an embodiment, the gate insulation layer 262 may include a silicon oxide layer, and the gate electrode 264 may include a polysilicon layer doped with impurities. The gate insulation layer 262 and the gate electrode 264 may generally extend onto the N-type drift region 230 and a portion of the isolation layer 250, and the extended gate electrode may function as a first field plate 266. That is, the first field plate 266 may generally extend from the gate electrode 264 toward the N-type drain region 248. The first field plate 266 may include the same material layer as the gate electrode 264. For example, when the gate electrode 264 is formed of a doped polysilicon layer, the first field plate 266 may also be formed of a doped polysilicon layer.

A second field plate 274 may be disposed on the isolation layer 250 to be spaced apart from the first filed plate 266. A first insulation layer 272 may be disposed substantially between the second field plate 274 and the isolation layer 250. A coupling gate 278 may be disposed generally on an edge of the isolation layer 250, which may be adjacent to the N-type drain region 248. That is, the coupling gate 278 may be generally disposed on the isolation layer 250 substantially between the N-type drain region 248 and the second field plate 274. A second insulation layer 276 may be disposed substantially between the coupling gate 278 and the isolation layer 250. Although not shown in the drawings, an interlayer insulation layer having a certain dielectric constant may be disposed substantially between the coupling gate 278 and the second contact 284. As illustrated in FIG. 1, the second field plate 274 and the coupling gate 278 may generally be parallel with each other and may be spaced apart from each other by a distance D1. One end of the second field plate 274 may be electrically connected to one end of the coupling gate 278 through a conductive connector 286.

In an exemplary embodiment, the second field plate 274, the coupling gate 278 and the conductive connector 286 may be formed of substantially the same material layer (e.g., a doped polysilicon layer) as the gate electrode 264. Further, an additional second field plate 274 and an additional coupling gate 278 may be disposed generally on the isolation layer 250. The additional second field plate 274 and the second field plate 274 may be disposed to be generally symmetrical with respect to the N-type drain region 248. Similarly, the additional coupling gate 278 and the coupling gate 278 may be disposed to be generally symmetrical with respect to the N-type drain region 248. Moreover, one end of the additional second field plate 274 may be electrically connected to one end of the additional coupling gate 278 through an additional conductive connector 286.

In the aforementioned LDMOS transistor, if a gate voltage over a threshold voltage is applied to the gate electrode 264 and a positive drain voltage is applied between the N-type drain region 248 and the P-type source contact region 244 (e.g., the N-type source region 242 having a ground voltage), electrons in the N-type source region 242 may drift into the N-type drain region 248 through an inversion channel layer formed generally in the channel region 246 and the drift region 230. When the gate voltage over a threshold voltage is applied to the gate electrode 264 and the positive drain voltage is applied to the N-type drain region 248, substantially the same voltage as the gate voltage may also be applied to the first field plate 266. Thus, the electric field generated by the gate voltage may be uniformly distributed at substantially an edge of the isolation layer 250 adjacent to the channel region 246, thereby suppressing the degradation of a breakdown characteristic such as a drain junction breakdown voltage characteristic.

Further, the coupling gate 278 may have a coupling bias induced by the drain voltage applied to the second contact 284. The coupling bias may also be applied to the second field plate 274 electrically connected to the coupling gate 278. Thus, the electric field may be more uniformly distributed at generally edge regions of the N-type drain region 248 and the isolation layer 250 because of the presence of the coupling bias induced at the coupling gate 278 and the second field plate 274. Accordingly, the coupling bias induced at the coupling gate 278 and the second field plate 274 may further suppress the degradation of the breakdown characteristic of the LDMOS transistor. Consequently, the first field plate 266 may relieve the electric field concentration at a junction region between the N-type drift region 230 and the channel region 246, and the second field plate 274 and the coupling gate 278 may relieve the electric field concentration in the vicinity of the N-type drain region 248. Hence, the first field plate 266 may be independent of the second field plate 274 and the coupling gate 278 in terms of influencing regions.

Figure 3:
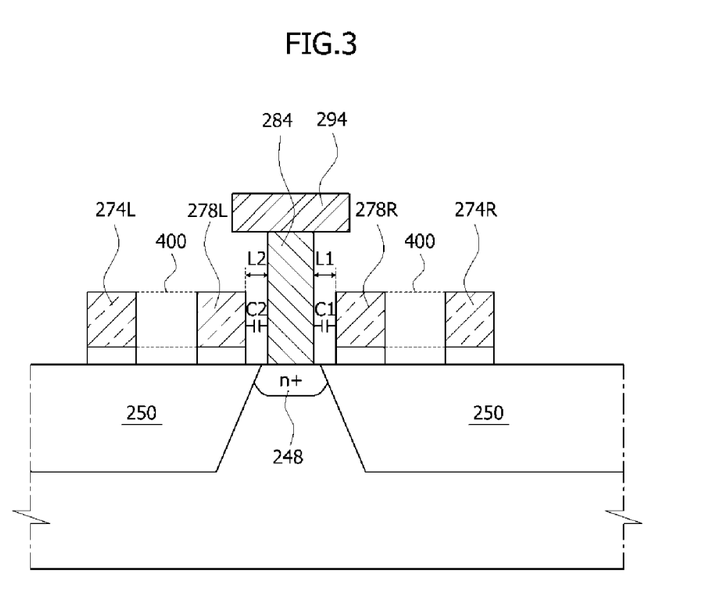
FIGS. 3 and 4 are cross sectional views illustrating an example of coupling gates of an LDMOS transistor according to an embodiment.

FIGS. 3 and 4 are cross sectional views illustrating an example of coupling gates of an LDMOS transistor according to an embodiment. In FIGS. 1, 2, 3 and 4, the same reference numerals or the same reference designators denote the same elements. Referring to FIG. 3, a pair of isolation layers 250 may be disposed to be generally symmetrical with respect to an N-type drain region 248 (i.e., n+) therebetween. Similarly, a pair of coupling gates 278R and 278L may be disposed to be generally symmetrical with respect to a second contact 284 therebetween, and a pair of second field plates 274R (i.e., right second field plate) and 273L (i.e., left second field plate) may be disposed to be generally symmetrical with respect to the second contact 284 therebetween. Regions illustrated by dotted lines 400 may denote the conductive connectors (286 of FIG. 1) that electrically connect the coupling gates 278R and 278L to the second field plates 274R and 273L. Thus, if a drain voltage is applied to a drain electrode 294, the drain voltage may be applied to the N-type drain region 248 through the second contact 284. Hence, coupling voltages induced at the coupling gates 278R and 278L and the second field plates 274R and 274L may be determined according to coupling ratios that relate to coupling capacitances between the second contact 284 and the coupling gates 278R and 278L.

The coupling ratios may depend on distances L1 and L2. The distance L1 corresponds to a distance between the second contact 284 and the right coupling gate 278R, and the distance L2 corresponds to a distance between the second contact 284 and the left coupling gate 278L. Thus, when the distances L1 and L2 increase, the coupling ratios may be reduced to lower the coupling voltages induced at the coupling gates 278R and 278L and the second field plates 274R and 274L. In contrast, when the distances L1 and L2 decrease, the coupling ratios may be increased to heighten the coupling voltages induced at the coupling gates 278R and 278L and the second field plates 274R and 274L. As illustrated in FIG. 3, if the coupling gates 278R and 278L are disposed to be substantially symmetrical with respect to the second contact 284, the first distance L1 may be substantially equal to the second distance L2. In this case, a first coupling capacitance C1 between the second contact 284 and the right coupling gate 278R may be substantially equal to a second coupling capacitance C2 between the second contact 284 and the left coupling gate 278L. Thus, a coupling ratio of the right coupling gate 278R may also be substantially equal to a coupling ratio of the left coupling gate 278L.

Figure 4:
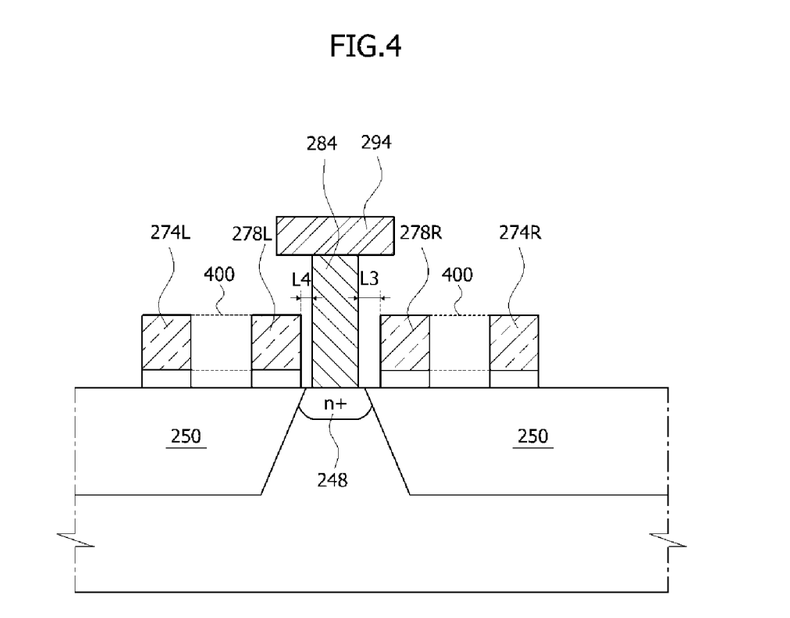

Alternatively, as illustrated in FIG. 4, the coupling gates 278R and 278L may be disposed to be generally unsymmetrical with respect to the second contact 284 therebetween. For example, when the coupling gates 278R and 278L may be shifted in a right direction (or the second contact 284 is shifted in a left direction), a distance L3 between the second contact 284 and the right coupling gate 278R may increase while a distance L4 between the second contact 284 and the left coupling gate 278L may decrease. That is, a coupling capacitance between the second contact 284 and the right coupling gate 278R may be less than a coupling capacitance between the second contact 284 and the left coupling gate 278L. Consequently, when a constant drain voltage is applied to the drain electrode 294, a coupling voltage induced at the right coupling gate 278R and the right second field plate 274R may be lowered but a coupling voltage induced at the left coupling gate 278L and the left second field plate 274L may be raised. Accordingly, the electric field concentration effect may be relatively less suppressed at a right side of the N-type drain region 248, whereas the electric field concentration effect may be relatively more suppressed at a left side of the N-type drain region 248 (i.e., n+). Although the present exemplary embodiment is described in conjunction with an example that the coupling gates 278R and 278L are shifted in a right direction (or the second contact 284 is shifted in a left direction), the inventive concept may be equally applicable to even another example that the coupling gates 278R and 278L are shifted in a left direction (or the second contact 284 is shifted in a right direction). That is, when the coupling gates 278R and 278L are shifted in a left direction, the electric field concentration effect may be relatively less suppressed at a left side of the N-type drain region 248 but the electric field concentration effect may be relatively more suppressed at a right side of the N-type drain region 248.

Figure 5:
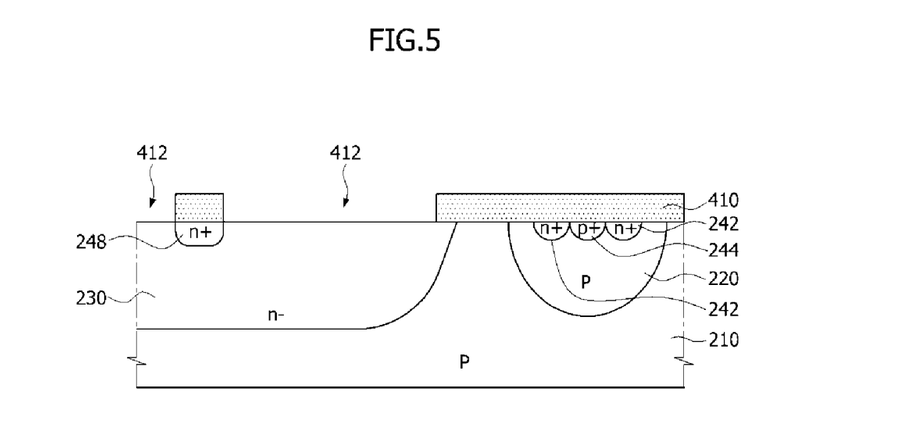
FIGS. 5 to 7 are cross sectional views illustrating an example of a method of fabricating an LDMOS transistor according to an embodiment.
Figure 6:
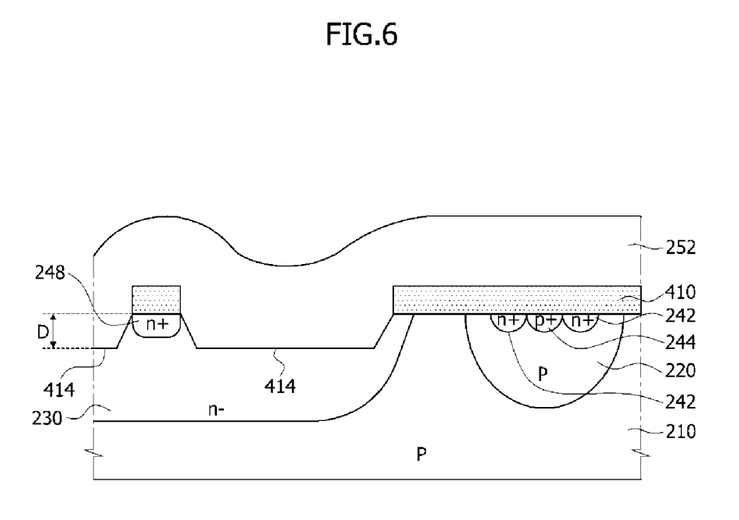
Figure 7:
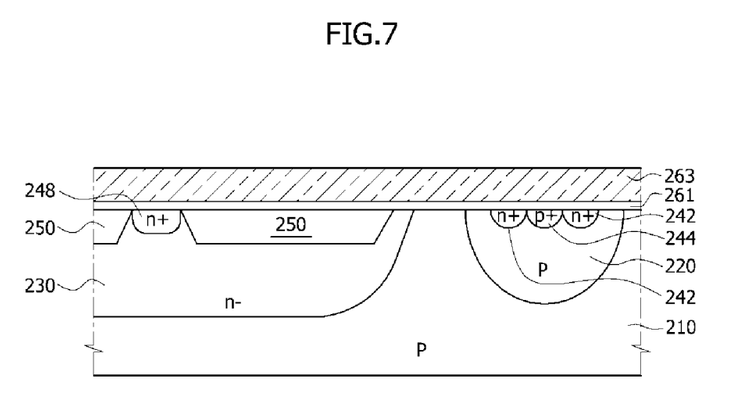

FIGS. 5, 6 and 7 are cross sectional views illustrating an example of a method of fabricating an LDMOS transistor according to an embodiment. Referring to FIG. 5, a P-type body region 220 (i.e., P) and an N-type drift region 230 (i.e., n−) may be formed substantially in a P-type substrate 210 (i.e., P). To form the P-type body region 220, P-type impurity ions (i.e., P) may be implanted into the substrate 210 using a mask pattern (not shown) having an opening that exposes a predetermined region of the substrate 210. Similarly, to form the N-type drift region 230, N-type impurity ions (i.e., n−) may be implanted into the substrate 210 using a mask pattern (not shown) having an opening that exposes another predetermined region of the substrate 210.

Subsequently, N-type impurity ions may be implanted generally into the N-type drift region 230 and the P-type body region 220, thereby forming an N-type drain region 248 (i.e., n+) in the N-type drift region 230 and an N-type source region 242 (i.e., n+) in the P-type body region 220. Further, P-type impurity ions may be implanted generally into the P-type body region 220, thereby forming a P-type source contact region 244 (i.e., p+) having sidewalls substantially surrounded by the N-type source region 242. A hard mask pattern 410 may be then formed generally on the substrate including the P-type body region 220, the N-type drift region 230, the N-type drain region 248, and the N-type source region 242. The hard mask pattern 410 may be used in the formation of isolation layers in a subsequent process. Thus, the hard mask pattern 410 may have openings that generally expose field regions in which the isolation layers are formed. For example, the hard mask pattern 410 may be formed to generally expose portions of the N-type drift region 230 generally surrounding the sidewalls of the N-type drain region 248. In an exemplary embodiment, the hard mask pattern 410 may be formed of a nitride layer. Alternatively, the hard mask pattern 410 may be formed of a multi-layered material including an oxide layer and a nitride layer.

Referring to FIG. 6, the substrate (e.g., the exposed N-type drift region 230) (i.e., n−) may be etched using the hard mask pattern 410 as an etch mask, thereby forming trenches 414 generally in the N-type drift region 230. If a depth D of the trenches 414 increases, a path along which carriers are drifted from the source region 242 (i.e., n+) generally toward the drain region 248 (i.e., n+) may become longer to increase the on-resistance of the LDMOS transistor. Hence, the trenches 414 may be formed to have an appropriate depth. For example, the trenches 414 may be formed to have a depth of about 3000 angstroms (Å) to about 5500 angstroms (Å). An insulation layer 252 may be formed substantially on the hard mask pattern 410 and substantially in the trenches 414. In an exemplary embodiment, the insulation layer 252 may be formed of a high density plasma (HDP) oxide layer.

Referring to FIG. 7, a planarization process may be performed to substantially remove the hard mask pattern 410 and a portion of the insulation layer 252. As a result, isolation layers 250 may be formed generally in respective ones of the trenches 414. An insulation layer 261 and a conductive layer 263 may be then sequentially formed substantially on an entire surface of the substrate including the isolation layers 250. In an embodiment, the insulation layer 261 may be formed of a silicon oxide layer and the conductive layer 263 may be formed of a doped polysilicon layer. The conductive layer 263 and the insulation layer 261 may be patterned to form the gate electrode 264, the first field plate 266, the second field plate 274, the coupling gate 278, the conductive connector 286, the gate insulation layer 262, the first insulation layer 272 and the second insulation layer 276 that are illustrated in FIGS. 1 and 2. The conductive layer 263 and the insulation layer 261 may be patterned such that the second field plate 274 and the coupling gate 278 are connected to each other by the conductive connector 286, as illustrated in FIG. 1.

Subsequently, first and second contacts 282 and 284 may be formed, as illustrated in FIG. 2. Specifically, an interlayer insulation layer (not shown) may be formed on the substrate including the gate electrode 264, the field plates 266 and 274, the coupling gate 278, and the conductive connector 286. The interlayer insulation layer may be formed to have openings that generally expose the P-type source contact region 244 (i.e., p+) and the N-type drain region 248 (i.e., n+). A first contact 282 and a second contact 284 may be then formed substantially in the opening generally exposing the P-type source contact region 244 and the opening generally exposing the N-type drain region 248, respectively. A source electrode 292 and a drain electrode 294 may be then formed substantially on the interlayer insulation layer using, for example, a metallization process. The source electrode 292 and the drain electrode 294 may be electrically connected to the first contact 282 and the second contact 284, respectively.

Figure 8:
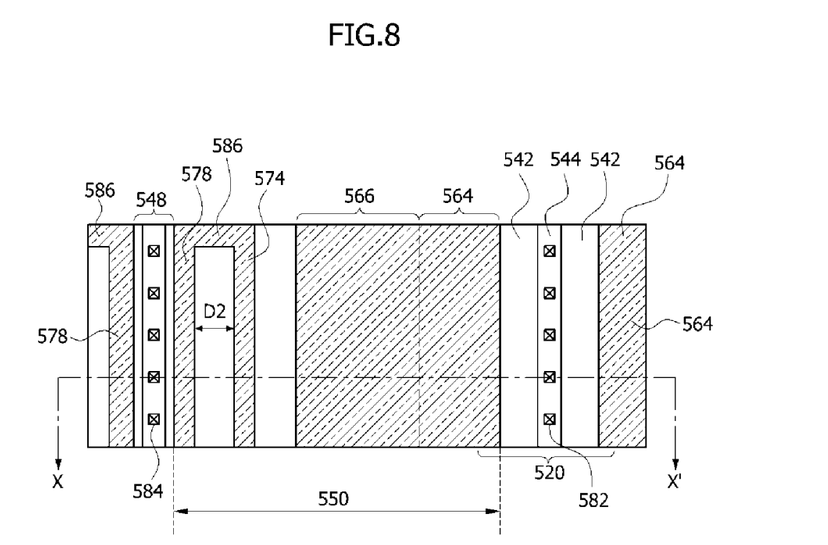
FIG. 8 is a layout illustrating an example of a LDMOS transistor according to another embodiment.
Figure 9:
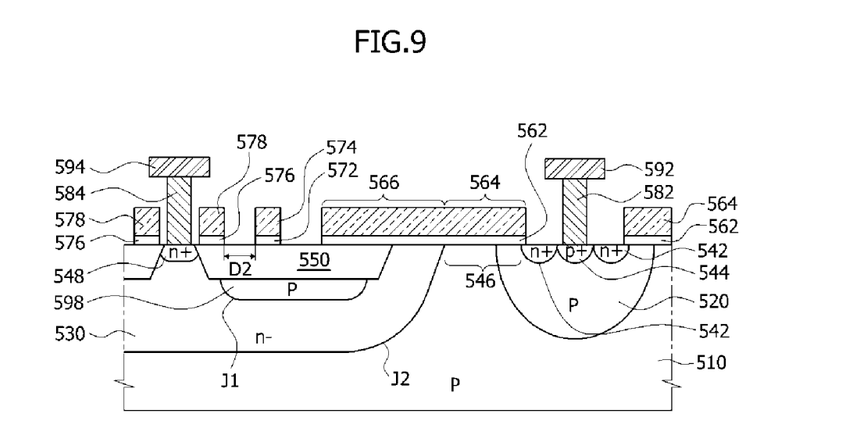
FIG. 9 is a cross sectional view taken along a line X-X' of FIG. 8.

FIG. 8 is a layout illustrating an LDMOS transistor according to another embodiment, and FIG. 9 is a cross sectional view taken along a line X-X' of FIG. 8. Referring to FIGS. 8 and 9, an LDMOS transistor according to the present embodiment may have a reduced surface field (RESURF) structure. The LDMOS transistor according to the present embodiment may include a P-type body region 520 (i.e., P) and an N-type drift region 530 (i.e., n−) which are disposed to be spaced apart from each other substantially within a P-type substrate 510 (i.e., P). The P-type body region 520 and the N-type drift region 530 may be disposed to be substantially adjacent to a top surface of the P-type substrate 510. Although the present exemplary embodiment is described in conjunction with an example that the P-type body region 520 and the N-type drift region 530 are spaced apart from each other, a sidewall of the P-type body region 520 may generally contact a sidewall of the N-type drift region 530 in some other embodiments. In an embodiment, the P-type body region 520 and the N-type drift region 530 may be silicon epitaxial layers grown substantially on the P-type substrate 510.

An N-type source region 542 (i.e., n+) and a P-type source contact region 544 (i.e., p+) surrounded by the N-type source region 542 may be disposed substantially in the P-type body region 520. The N-type source region 542 and the P-type source contact region 544 may be disposed to be generally adjacent to a top surface of the P-type body region 520, and the N-type source region 542 may substantially surround sidewalls of the P-type source contact region 544. The P-type source contact region 544 may be electrically connected to a source electrode 592 through at least one first contact 582. In an exemplary embodiment, the first contact 582 may be disposed to contact both the P-type source contact region 544 and the N-type source region 542.

Upper surface regions of the P-type substrate 510 and the P-type body region 520 generally between the N-type drift region 530 and the N-type source region 542 may act as a channel region 546. An isolation layer 550 may be disposed substantially in the N-type drift region 530, and the isolation layer 550 may be adjacent to generally a top surface of the N-type drift region 530. An N-type drain region 548 may also be disposed in the N-type drift region 530, and the isolation layer 550 may surround sidewalls of the N-type drain region 548. The N-type drain region 548 and the N-type source region 542 may have higher impurity concentrations than the N-type drift region 530. The N-type drain region 548 (i.e., n+) may be electrically connected to a drain electrode 594 through at least one second contact 584.

A gate insulation layer 562 may be disposed substantially on the channel region 546, and a gate electrode 564 may be disposed substantially on the gate insulation layer 562 generally opposite to the channel region 546. In an exemplary embodiment, the gate insulation layer 562 may include a silicon oxide layer, and the gate electrode 564 may include a polysilicon layer doped with impurities. The gate insulation layer 562 and the gate electrode 564 may generally extend onto the N-type drift region 530 and a portion of the isolation layer 550, and the extended gate electrode may function as a first field plate 566. That is, the first field plate 566 may generally extend from the gate electrode 564 toward the N-type drain region 548. The first field plate 566 may include the same material layer as the gate electrode 564. For example, when the gate electrode 564 is formed of a doped polysilicon layer, the first field plate 566 may also be formed of a doped polysilicon layer.

A second field plate 574 may be disposed on the isolation layer 550 and may be spaced apart from the first filed plate 566. A first insulation layer 572 may be disposed substantially between the second field plate 574 and the isolation layer 550. A coupling gate 578 may be disposed generally on an edge of the isolation layer 550, which is substantially adjacent to the N-type drain region 548. That is, the coupling gate 578 may be disposed substantially on the isolation layer 550 generally between the N-type drain region 548 and the second field plate 574. A second insulation layer 576 may be disposed substantially between the coupling gate 578 and the isolation layer 550. Although not shown in the drawings, an interlayer insulation layer having a certain dielectric constant may be disposed between the coupling gate 578 and the second contact 584. As illustrated in FIG. 9, the second field plate 574 and the coupling gate 578 may be substantially parallel with each other and may be spaced apart from each other by a distance D2. One end of the second field plate 574 may be electrically connected to one end of the coupling gate 578 through a conductive connector 586.

In an exemplary embodiment, the second field plate 574, the coupling gate 578 and the conductive connector 586 may be formed of substantially the same material layer (e.g., a doped polysilicon layer) as the gate electrode 564. Further, an additional second field plate 574 and an additional coupling gate 578 may be disposed substantially on the isolation layer 550. The additional second field plate 574 and the second field plate 574 may be disposed to be generally symmetrical with respect to the N-type drain region 548. Similarly, the additional coupling gate 578 and the coupling gate 578 may be disposed to be substantially symmetrical with respect to the N-type drain region 548. Moreover, one end of the additional second field plate 574 may be electrically connected to one end of the additional coupling gate 578 through an additional conductive connector 586. A P-type top region 598 (i.e., P) may be disposed substantially within the N-type drift region 530 and may be disposed substantially underneath the isolation layer 550.

In the aforementioned LDMOS transistor, if a gate voltage over a threshold voltage is applied to the gate electrode 564 and a positive drain voltage is applied between the N-type drain region 548 and the P-type source contact region 544 (e.g., the N-type source region 542 having a ground voltage), electrons in the N-type source region 542 may drift into the N-type drain region 548 through an inversion channel layer formed in the channel region 546 and the drift region 530. In the event that the gate voltage over the threshold voltage and the drain voltage over the ground voltage are respectively applied to the gate electrode 564 and the N-type drain region 548, a reverse bias may be applied to a first junction 31 substantially between the N-type drift region 530 and the P-type top region 598 as well as a second junction 32 substantially between the N-type drift region 530 and the P-type substrate 510. In this case, a total width of a depletion region formed in the N-type drift region 530 may be a sum of the width of a depletion region formed in the N-type drift region 530 adjacent to the first junction 31 and the width of a depletion region formed in the N-type drift region 530 adjacent to the second junction 32. Thus, in some exemplary embodiments, the N-type drift region 530 may be completely depleted because of the presence of the P-type top region 598. Consequently, a surface electric field between the N-type source region 542 and the N-type drain region 548 may be more uniformly distributed without substantially any or any electric field concentration due to the presence of the P-type top region 598. Accordingly, a breakdown voltage, for example, a drain junction breakdown voltage may be increased.

When the gate voltage is applied to gate electrode 564, substantially the same voltage or the same voltage as the gate voltage may also be applied to the first field plate 566. Thus, the electric field generated by the gate voltage may be uniformly distributed at generally an edge of the isolation layer 550 adjacent to the channel region 546, thereby suppressing the degradation of a breakdown characteristic such as a drain junction breakdown voltage characteristic.

Further, the coupling gate 578 may have a coupling bias induced by the drain voltage applied to the second contact 584. The coupling bias of the coupling gate 578 may also be applied to the second field plate 574 electrically connected to the coupling gate 578. Thus, the electric field may be more uniformly distributed at edge regions of the N-type drain region 548 and the isolation layer 550 because of the presence of the coupling bias induced at the coupling gate 578 and the second field plate 574. Accordingly, the coupling bias induced at the coupling gate 578 and the second field plate 574 may further suppress the degradation of the breakdown characteristic of the LDMOS transistor. Consequently, the first field plate 566 may relieve the electric field concentration at a junction region substantially between the N-type drift region 530 and the channel region 546, and the second field plate 574 and the coupling gate 578 may relieve the electric field concentration within the vicinity of the N-type drain region 548. Hence, the first field plate 566 may be independent of the second field plate 574 and the coupling gate 578 in terms of influencing regions.

Moreover, even though the pair of coupling gates 578 at both sides of the second contact 584 are shifted in a right direction (or in a left direction), the electric field concentration effect may be relatively less suppressed at the right side (or a left side) of the N-type drain region 548 while the electric field concentration effect may be relatively more suppressed at a left side (or a right side) of the N-type drain region 548, as described with reference to FIGS. 3 and 4.

Figure 10:
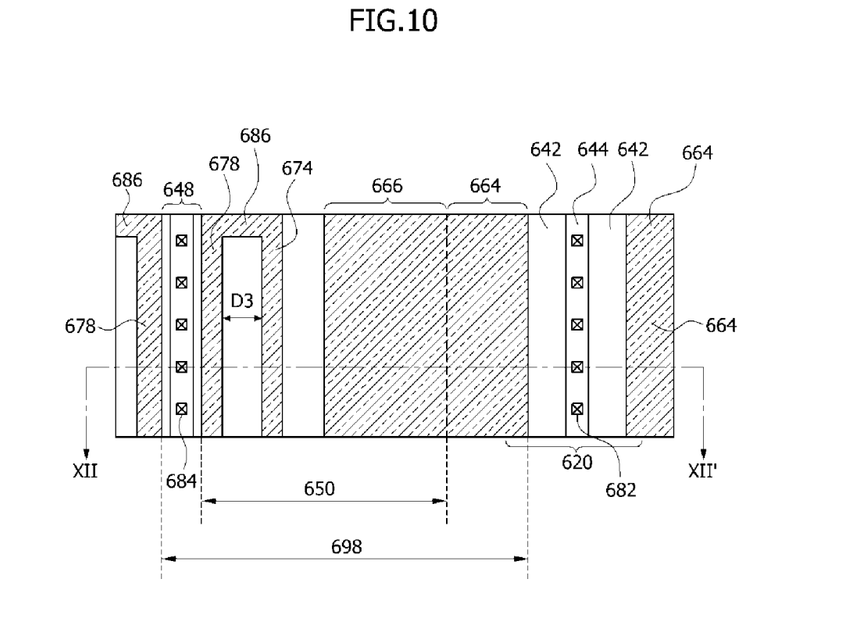
FIG. 10 is a layout illustrating an example of a LDMOS transistor according to yet another embodiment.
Figure 11:
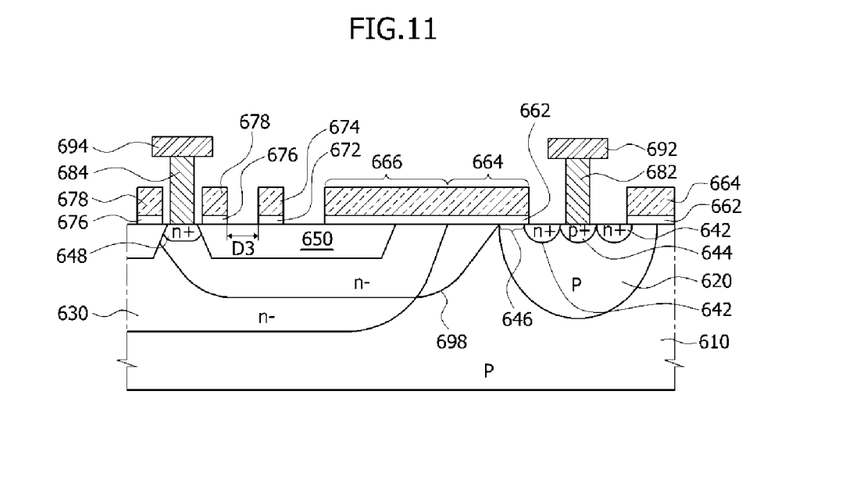
FIG. 11 is a cross sectional view taken along a line X II-X II' of FIG. 10.

FIG. 10 is a layout illustrating an LDMOS transistor according to yet another embodiment, and FIG. 11 is a cross sectional view taken along a line X II-X II' of FIG. 10. Referring to FIGS. 10 and 11, an LDMOS transistor according to the present embodiment may include a P-type body region 620 (i.e., P) and an N-type drift region 630 (i.e., n−) which are disposed to be spaced apart from each other in a P-type substrate 610 (i.e., P). The P-type body region 620 and the N-type drift region 630 may be disposed to be generally adjacent to a top surface of the P-type substrate 610. In an exemplary embodiment, the P-type body region 620 and the N-type drift region 630 may be silicon epitaxial layers grown substantially on the P-type substrate 610.

An N-type source region 642 (i.e., n+) and a P-type source contact region 644 (i.e., P+) substantially surrounded by the N-type source region 642 may be disposed substantially within the P-type body region 620. The N-type source region 642 and the P-type source contact region 644 may be disposed to be generally adjacent to a top surface of the P-type body region 620, and the N-type source region 642 may substantially surround the sidewalls of the P-type source contact region 644. The P-type source contact region 644 may be electrically connected to a source electrode 692 through at least one first contact 682. In an exemplary embodiment, the first contact 682 may be disposed to contact both the P-type source contact region 644 and the N-type source region 642.

An upper surface region of the P-type body region 620 adjacent to the N-type source region 642 may act as a channel region 646. An isolation layer 650 may be disposed in the N-type drift region 630, and the isolation layer 650 may be adjacent to generally a top surface of the N-type drift region 630. An N-type drain region 648 (i.e., n+) may also be substantially disposed in the N-type drift region 630, and the isolation layer 650 may substantially surround sidewalls of the N-type drain region 648. The N-type drain region 648 and the N-type source region 642 may have higher impurity concentrations than the N-type drift region 630. The N-type drain region 648 may be electrically connected to a drain electrode 694 through at least one second contact 684.

The LDMOS transistor according to the present exemplary embodiment may further include an extended N-type drain region 698 (i.e., n−). The extended N-type drain region 698 may substantially surround the N-type drain region 648 and the isolation layer 650 in the N-type drift region 630 and generally may laterally extend to contact a sidewall of the P-type body region 620. A gate insulation layer 662 may be disposed substantially on the channel region 646, and a gate electrode 664 may be disposed substantially on the gate insulation layer 662 generally opposite to the channel region 646. In an embodiment, the gate insulation layer 662 may include a silicon oxide layer, and the gate electrode 664 may include a polysilicon layer doped with impurities. The gate insulation layer 662 and the gate electrode 664 may generally extend onto the extended N-type drain region 698, the N-type drift region 630 and a portion of the isolation layer 650, and the extended gate electrode may function as a first field plate 666.

That is, the first field plate 666 may substantially extend from the gate electrode 664 generally toward the N-type drain region 648. The first field plate 666 may include the substantially the same material layer as the gate electrode 664. For example, when the gate electrode 664 is formed of a doped polysilicon layer, the first field plate 666 may also be formed of a doped polysilicon layer.

A second field plate 674 may be disposed substantially on the isolation layer 650 and may be spaced apart from the first filed plate 666. A first insulation layer 672 may be disposed substantially between the second field plate 674 and the isolation layer 650. A coupling gate 678 may be disposed substantially on an edge of the isolation layer 650, which is generally adjacent to the N-type drain region 648. That is, the coupling gate 678 may be disposed substantially on the isolation layer 650 substantially between the N-type drain region 648 and the second field plate 674. A second insulation layer 676 may be disposed substantially between the coupling gate 678 and the isolation layer 650. Although not shown in the drawings, an interlayer insulation layer having a certain dielectric constant may be disposed substantially between the coupling gate 678 and the second contact 684. As illustrated in FIG. 10, the second field plate 674 and the coupling gate 678 may be generally parallel with each other and may be spaced apart from each other by a distance D3. One end of the second field plate 674 may be electrically connected to one end of the coupling gate 678 through a conductive connector 686.

In an exemplary embodiment, the second field plate 674, the coupling gate 678 and the conductive connector 686 may be formed of substantially the same material layer (e.g., a doped polysilicon layer) as the gate electrode 664. Further, an additional second field plate 674 and an additional coupling gate 678 may be disposed substantially on the isolation layer 650. The additional second field plate 674 and the second field plate 674 may be disposed to be generally symmetrical with respect to the N-type drain region 648. Similarly, the additional coupling gate 678 and the coupling gate 678 may be disposed to be substantially symmetrical with respect to the N-type drain region 648. Moreover, one end of the additional second field plate 674 may be electrically connected to one end of the additional coupling gate 678 through an additional conductive connector 686.

In the aforementioned LDMOS transistor, if a gate voltage over a threshold voltage is applied to the gate electrode 664 and a positive drain voltage is applied between the N-type drain region 648 and the P-type source contact region 644 (e.g., the N-type source region 642 having a ground voltage), electrons in the N-type source region 642 may drift into the N-type drain region 648 through an inversion channel layer formed in the channel region 646 and the extended N-type drain region 698. In the event that the gate voltage is applied to the gate electrode 664, substantially the same or the same voltage as the gate voltage may also be applied to the first field plate 666. Thus, the electric field generated by the gate voltage may be uniformly distributed at generally an edge of the isolation layer 650 adjacent to the channel region 646, thereby suppressing the degradation of a breakdown characteristic such as a drain junction breakdown voltage characteristic.

Further, the coupling gate 678 may have a coupling bias induced by the drain voltage applied to the second contact 684. The coupling bias of the coupling gate 678 may also be applied to the second field plate 674 electrically connected to the coupling gate 678. Thus, the electric field may be more uniformly distributed generally at edge regions of the N-type drain region 648 and the isolation layer 650 because of the presence of the coupling bias induced at the coupling gate 678 and the second field plate 674. Accordingly, the coupling bias induced at the coupling gate 678 and the second field plate 674 may further suppress the degradation of the breakdown characteristic of the LDMOS transistor. Consequently, the first field plate 666 may relieve the electric field concentration at a junction region substantially between the extended N-type drain region 698 and the channel region 646, and the second field plate 674 and the coupling gate 678 may relieve the electric field concentration at a vicinity of the N-type drain region 648. Hence, the first field plate 666 may be independent of the second field plate 674 and the coupling gate 678 in terms of influencing regions.

Moreover, even though the pair of coupling gates 678 at both sides of the second contact 684 are shifted in generally a right direction (or in a left direction), the electric field concentration effect may be relatively less suppressed at a right side (or a left side) of the N-type drain region 648 while the electric field concentration effect may be relatively more suppressed at a left side (or a right side) of the N-type drain region 648, as described with reference to FIGS. 3 and 4.

According to the exemplary embodiments set forth above, a gate electrode on a channel region may extend substantially toward a drain region, and the extended gate electrode may function as a first field plate. Further, a coupling gate and a second field plate may be disposed substantially between the drain region and the first field plate. Thus, when a gate voltage is applied to the gate electrode, the same voltage as the gate voltage may also be applied to the first field plate to suppress an electric field concentration effect at generally an edge of the channel region substantially adjacent to the drain region. In addition, when a drain voltage is applied to a drain contact disposed substantially on the drain region, a coupling bias can be induced at the coupling gate due to a coupling capacitance substantially between the drain contact and the coupling gate. The coupling bias induced at the coupling gate can suppress an electric field concentration effect at a vicinity of the drain region. Consequently, the first field plate may be independent of the second field plate and the coupling gate in terms of influencing regions, and the second field plate and the coupling gate may further improve breakdown voltage characteristics of an LDMOS transistor.

Moreover, in the event that a first coupling gate and a second coupling gate are respectively disposed at both sides of the drain contact, the drain contact may be shifted generally toward one of the pair of coupling gates due to a misalignment. However, even though the drain contact is shifted generally toward one of the pair of coupling gates, the electric field concentration effect may be relatively less suppressed at one side of the drain region while the electric field concentration effect may be relatively more suppressed at the other side of the drain region.

The exemplary embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A lateral double diffused MOS transistor, comprising:
    a substrate of a first conductivity type;
    a drift region of a second conductivity type and a body region of the first conductivity type disposed substantially in the substrate;
    a source region of the second conductivity type disposed substantially in the body region;
    a drain region of the second conductivity type disposed substantially in the drift region;
    a trench isolation layer disposed substantially in the drift region, one side of the trench isolation layer being in contact with one side of the drain region;
    a gate insulation layer and a gate electrode sequentially stacked generally on the body region;
    a first field plate extending from the gate electrode to overlap the drift region and to overlap a portion of the trench isolation layer;
    a second field plate disposed substantially above the trench isolation layer spaced apart from the first field plate, the second field plate disposed between the first field plate and the drain region; and
    a coupling gate disposed substantially above the trench isolation layer, the coupling gate spaced apart from the second field plate, and the coupling gate disposed between the drain region and the second field plate,
    wherein the coupling gate is electrically connected to the second field plate.

2. The lateral double diffused MOS transistor of claim 1, further comprising:
    an additional coupling gate being adjacent to the drain region and generally opposite to the coupling gate; and
    an additional second field plate being adjacent to the drain region and generally opposite to the second field plate,
    wherein the additional coupling gate is electrically connected to the additional second field plate.

3. The lateral double diffused MOS transistor of claim 1, wherein the coupling gate has a coupling voltage induced by a coupling ratio of a drain voltage applied to the drain region.

4. The lateral double diffused MOS transistor of claim 1, wherein each of the coupling gate and the second field plate includes generally the same material layer as the gate electrode.

5. The lateral double diffused MOS transistor of claim 1, wherein each of the coupling gate and the second field plate includes a polysilicon layer.

6. The lateral double diffused MOS transistor of claim 1, further comprising:
    a first insulation layer substantially between the second field plate and the trench isolation layer; and
    a second insulation layer substantially between the coupling gate and the trench isolation layer.

7. The lateral double diffused MOS transistor of claim 6, wherein each of the first insulation layer and the second insulation layer includes an oxide layer.

8. The lateral double diffused MOS transistor of claim 1, further comprising:
    a first contact connected to the source region; and
    a second contact connected to the drain region.

9. A method of fabricating a lateral double diffused MOS transistor, the method comprising:
    forming a drift region of a second conductivity type and a body region of a first conductivity type substantially in a substrate of the first conductivity type;
    forming a source region of the second conductivity type substantially in the body region and a drain region of the second conductivity type substantially in the drift region;
    forming a trench isolation layer substantially in the drift region, one side of the trench isolation layer being in contact with one side of the drain region;
    forming a gate insulation layer generally on the body region;
    forming a gate electrode disposed generally on the gate insulation layer to substantially overlap with the body region and a first field plate extending from the gate electrode to substantially overlap with the drift region and a portion of the trench isolation layer; and forming a coupling gate and a second field plate disposed generally on the trench isolation layer to be spaced apart from the first field plate, wherein the coupling gate is formed generally between the drain region and the second field plate, the second field plate is formed generally between the coupling gate and first field plate, and the coupling gate is electrically connected to the second field plate.

\* \* \* \* \*